US010203221B2

(12) United States Patent
Hilgenberg et al.

(10) Patent No.: US 10,203,221 B2
(45) Date of Patent: Feb. 12, 2019

(54) SENSOR HAVING MOISTURE PROTECTION

(71) Applicant: Continental Teves AG & Co. oHG, Frankfurt (DE)

(72) Inventors: Udo Hilgenberg, Frankfurt am Main (DE); Stephan Risch, Weiterstadt (DE); Laszlo Boldizsar, Haszkovo Str. (HU); Ulrich Stählin, Eschborn (DE)

(73) Assignee: Continental Teves AG & Co. oHG, Frankfurt (DE)

( * ) Notice: Subject to any disclaimer, the term of this patent is extended or adjusted under 35 U.S.C. 154(b) by 143 days.

(21) Appl. No.: 14/653,588

(22) PCT Filed: Dec. 17, 2013

(86) PCT No.: PCT/EP2013/076867
§ 371 (c)(1),
(2) Date: Jun. 18, 2015

(87) PCT Pub. No.: WO2014/095835
PCT Pub. Date: Jun. 26, 2014

(65) Prior Publication Data
US 2015/0345988 A1 Dec. 3, 2015

(30) Foreign Application Priority Data

Dec. 20, 2012 (DE) .......... 10 2012 224 108
Sep. 20, 2013 (DE) .......... 10 2013 219 017

(51) Int. Cl.
*G01B 7/30* (2006.01)
*G01D 5/12* (2006.01)
(Continued)

(52) U.S. Cl.
CPC ........... *G01D 5/12* (2013.01); *G01B 7/30* (2013.01); *G01D 5/142* (2013.01); *G01D 5/145* (2013.01);
(Continued)

(58) Field of Classification Search
CPC ... G01B 7/14; G01B 7/30; G01D 5/12; G01D 5/142; G01D 5/145; G01D 11/245;
(Continued)

(56) References Cited

U.S. PATENT DOCUMENTS 6,275,027 B1 * 8/2001 Kogure .............. G01B 7/30
324/207.2
6,282,968 B1 9/2001 Sano
(Continued)

FOREIGN PATENT DOCUMENTS

DE 4017858 12/1991
DE 19733719 4/1999
(Continued)

OTHER PUBLICATIONS

German Search Report for German Application No. 10 2013 219 017.4 dated Oct. 28, 2013, including partial translation.
(Continued)

*Primary Examiner* — David M Schindler
(74) *Attorney, Agent, or Firm* — RatnerPrestia

(57) ABSTRACT

A method for detecting a phase angle difference between a first periodic measurement signal and a second periodic measurement signal, wherein, for the purpose of determining a torque applied to a shaft, the two periodic measurement signals describe a rotation of the shaft at an axial distance from one another including superimposing a periodic auxiliary signal which simulates a previously known rotational speed for the shaft on the first periodic measurement signal in order to form a superimposition signal, and determining the phase angle difference on the basis of the superimposition signal and the second measurement signal.

5 Claims, 5 Drawing Sheets

(51) Int. Cl.
*G01D 5/14* (2006.01)
*G01R 33/00* (2006.01)
*G01D 11/24* (2006.01)
*G01P 3/487* (2006.01)

(52) U.S. Cl.
CPC ............ *G01D 11/245* (2013.01); *G01P 3/487* (2013.01); *G01R 33/0052* (2013.01)

(58) Field of Classification Search
CPC .... G01R 33/0052; G01R 33/07; G01R 33/09; G01P 3/487
See application file for complete search history.

(56) References Cited

U.S. PATENT DOCUMENTS

| | | | | |
|---|---|---|---|---|
| 2001/0000713 | A1* | 5/2001 | Nakamura | F16C 19/185 |
| | | | | 384/448 |
| 2006/0274485 | A1 | 12/2006 | Godoy | |
| 2007/0290681 | A1* | 12/2007 | Yasuda | G01F 23/38 |
| | | | | 324/207.25 |
| 2009/0091317 | A1* | 4/2009 | Shimada | G01D 11/245 |
| | | | | 324/207.25 |
| 2010/0321006 | A1 | 12/2010 | Suzuki | |
| 2011/0254542 | A1* | 10/2011 | Meyer | F16C 3/02 |
| | | | | 324/207.25 |
| 2012/0056617 | A1* | 3/2012 | Hirose | B60Q 1/441 |
| | | | | 324/207.25 |
| 2015/0185005 | A1* | 7/2015 | Bartscht | G01C 9/06 |
| | | | | 33/365 |

FOREIGN PATENT DOCUMENTS

| | | |
|---|---|---|
| DE | 19811431 | 9/1999 |
| DE | 102005060173 | 7/2006 |
| DE | 10122542 | 12/2009 |
| EP | 1729093 | 12/2006 |
| WO | 2006029946 | 3/2006 |
| WO | 2008099749 | 8/2008 |

OTHER PUBLICATIONS

International Search Report for International Application No. PCT/EP2013/076867 dated Apr. 24, 2014.
Chinese Office Action dated Jul. 5, 2016 for Chinese Application No. 201380073388.1, including translation, 15 pages.

* cited by examiner

SENSOR HAVING MOISTURE PROTECTION

CROSS REFERENCE TO RELATED APPLICATION

This application is the U.S. National Phase Application of PCT International Application No. PCT/EP2013/076867, filed Dec. 17, 2013, which claims priority to German Patent Application No. 10 2012 224 108.6, filed Dec. 20, 2012 and German Patent Application No. 10 2013 219 017.4, filed, Sep. 20, 2013, the contents of such applications being incorporated by reference herein.

FIELD OF THE INVENTION

The invention relates to a sensor for emitting an electrical signal on the basis of a travel to be detected, in particular of an angle.

BACKGROUND OF THE INVENTION

WO 2006/029 946 A1 incorporated by reference herein discloses an angle sensor having a signal generator magnet and a measuring circuit with evaluation electronics for evaluating an angular position of the signal generator magnet. The signal generator magnet does not have any direct mechanical connection to the measuring circuit, with the result that from the point of view of the evaluation electronics the signal generator magnet hovers above the measuring circuit.

SUMMARY OF THE INVENTION

An aspect of the invention aims to improve the known angle sensor.

According to one aspect of the invention, a sensor for emitting an electrical signal based on a travel to be detected comprises a housing which spans an interior space and an exterior space, a signal generator which penetrates the housing from the exterior space into the interior space and which has a travel sensor element in the exterior space and a field signal generator element in the interior space, wherein the travel sensor element is configured to rotate the field signal generator element with respect to the housing on the basis of the travel to be detected, an evaluation circuit for detecting a physical field which is output by the field signal generator element, and a moisture protection element for protecting a gap between the housing and the signal generator against penetrating moisture.

The specified sensor is based on the idea that it could be used on a vehicle for detecting a relative position of a wheel of the vehicle with respect to its chassis. In this way, an active chassis control system could be implemented with which the classic conflict of objectives between a sporty and a comfortable adjustment of the chassis and suspension could be resolved.

However, it becomes apparent here that such sensors are very susceptible to faults and therefore have a relatively short service life. Within the scope of the specified sensor it is recognized here that a main cause of the short service life is the moisture penetrating into the sensor which damages the evaluation circuit of the sensor and makes it functionally incapable. This penetrating moisture is caused by the fact that the sensor is mounted on the underside of the vehicle and is subjected directly to dirt and moisture which is thrown up from the road.

The specified sensor is therefore based on the idea of protecting said sensor and, in particular, its evaluation circuit against penetrating moisture by a moisture protection element.

The moisture protection element can be embodied in any desired fashion. In a particularly advantageous fashion, the moisture protection element comprises a labyrinth which is configured to lengthen a flowpath of the penetrating moisture in the gap. Such a labyrinth can be implemented by means of simple geometric changes to the housing and/or signal generator and therefore requires in principle no new elements, with the result that the moisture protection element could be implemented in the specified sensor in a cost-neutral fashion.

In one development of the specified sensor, the labyrinth is embodied from a first sleeve which is embodied on the signal generator, and a second sleeve which is embodied on the housing and which engage one in the other. Two such sleeves would lengthen the abovementioned gap between the housing and the signal generator in an axial fashion with the result that the entry of the penetrating moisture into the interior space is delayed to a high degree.

In another development, the specified sensor comprises a bypass element which is configured to conduct the penetrating moisture past the gap. In this way, the avoidance of the penetration of the moisture could be improved further.

In a further development of the specified sensor, the bypass element is a drainage channel which is embodied in at least one of the two sleeves. This drainage channel can be embodied in a cost-neutral fashion on the sleeves by means of simple geometric changes, without additional technical elements being necessary. The drainage channel can, for example, conduct the water circumferentially past the gap, wherein the water would then drop down from the drainage channel underneath the gap without penetrating said gap.

In one preferred development of the specified sensor, the corresponding other sleeve has a projection which engages in the drainage channel. In this way, the previously mentioned gap is lengthened even further and the labyrinth effect is therefore enhanced further.

In order to enhance the labyrinth effect even further, at least one of the two sleeves, but preferably both bushings, can engage respectively in a circumferential groove which is correspondingly embodied on the housing and/or on the signal generator.

In yet another development of the specified sensor, the housing and/or the signal generator is embodied conically running away from an inlet point of the gap. In this way, the quantity of moisture which can potentially enter the gap at all is reduced.

It is particularly preferred to embody the conical profile here on the inside and on the outside, with the result that moisture penetrating the gap on the inside is conducted back again to the gap.

According to a further aspect of the invention, a vehicle comprises one of the specified sensors.

BRIEF DESCRIPTION OF THE DRAWINGS

The properties, features and advantages of this invention which are described above and the way in which they are achieved become clearer and more clearly comprehensible in relation to the following description of exemplary embodiments which are explained in more detail in relation to the drawings, wherein.

DETAILED DESCRIPTION OF THE PREFERRED EMBODIMENTS

Identical technical elements are provided with identical reference symbols in the figures and described only once.

Figure 1:
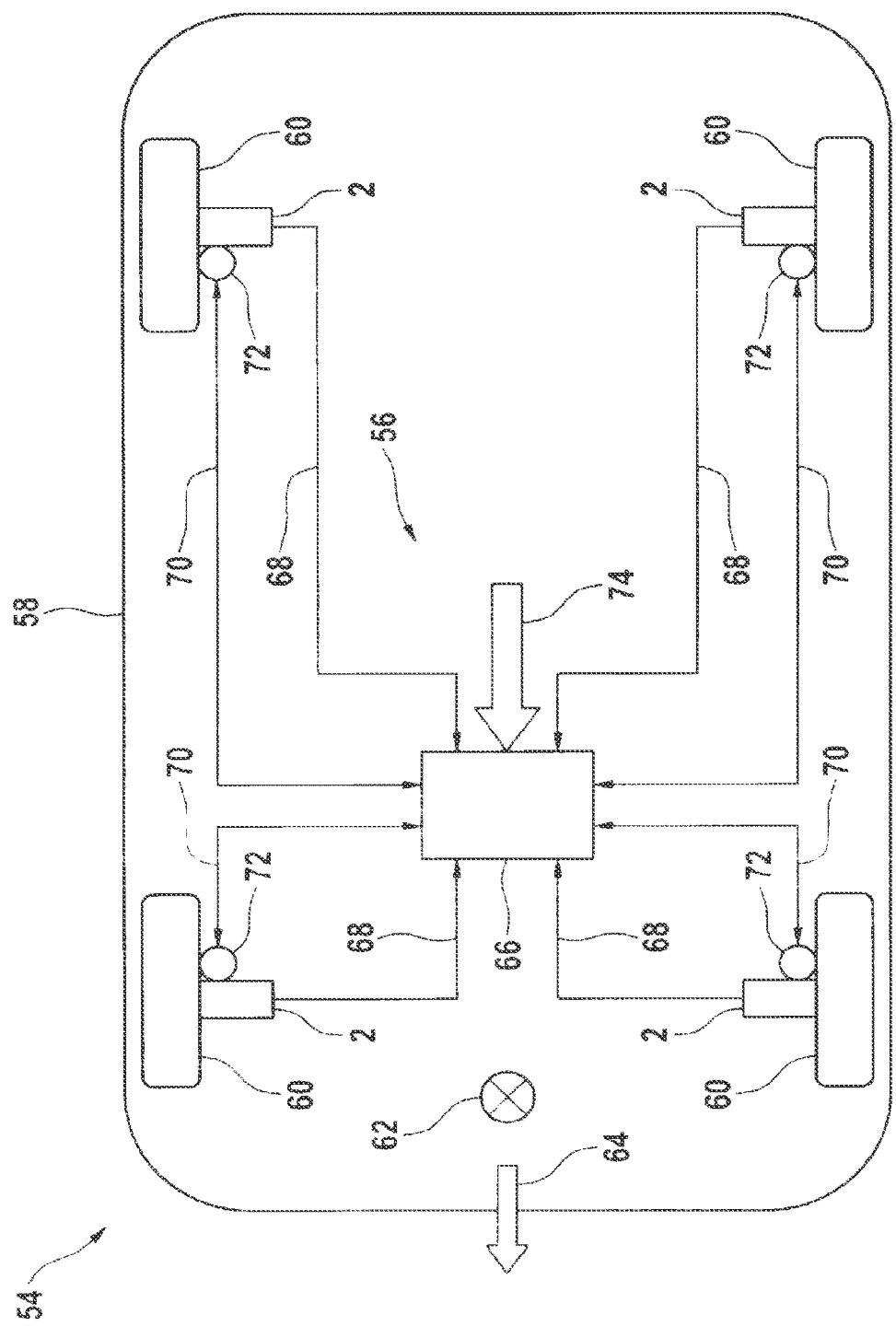
FIG. 1 shows a schematic view of a vehicle with a chassis control system.

Reference is made to FIG. 1 which shows, in a schematic view, a vehicle 54 with a chassis control system 56.

Within the scope of this chassis control system 56, lifting movements, pitching movements and rolling movements of a chassis 58 with respect to a road (not illustrated further) on which wheels 60 of the vehicle 54 roll in a positionally fixed fashion in a vertical axis 62 are to be minimized in order to improve the driving properties of the vehicle 54 when travelling in a direction of travel 64.

For this purpose, the chassis control system has, in a fashion known, for example, from DE 10 2005 060 173 A1, incorporated by reference herein, a control device 66 which, in the present embodiment composed of angle sensors 2 which are arranged on each wheel 60, receives rotational angles 68 which describe a relative position of the corresponding wheel 60 with respect to the chassis 58. On the basis of the differences between these rotational angles 68, the control device 66 determines whether the chassis 58 is moving in the vertical axis 62, that is to say is carrying out a lifting movement, or whether the chassis 58 is rolling or pitching, and controls. In this case, the control device 66 calculates a counter-movement, counteracting this lifting movement, rolling movement and/or pitching movement, and controls, with suitable control signals 70, active spring struts 72 which are arranged on the wheels 60, in order to compensate this counter-movement with the chassis 6. For example, the spring struts which are known from DE 101 22 542 B4, incorporated by reference herein, can be used as active spring struts 72.

In order to take into account lifting movements, rolling movements and/or pitching movements caused by the position of the road, for example during cornering, a suitable setpoint value 74 can be fed to the control device.

The angle sensors 2 are embodied in the present embodiment as chassis position sensors 2, referred to below as CPS sensors 2. The chassis position sensor measures a relative position of the chassis 58 of the vehicle 2 with respect to its chassis and suspension or one of the wheels 60. One of these CPS sensors 2 will be described in more detail below with reference to FIGS. 2 to 5.

Figure 2:
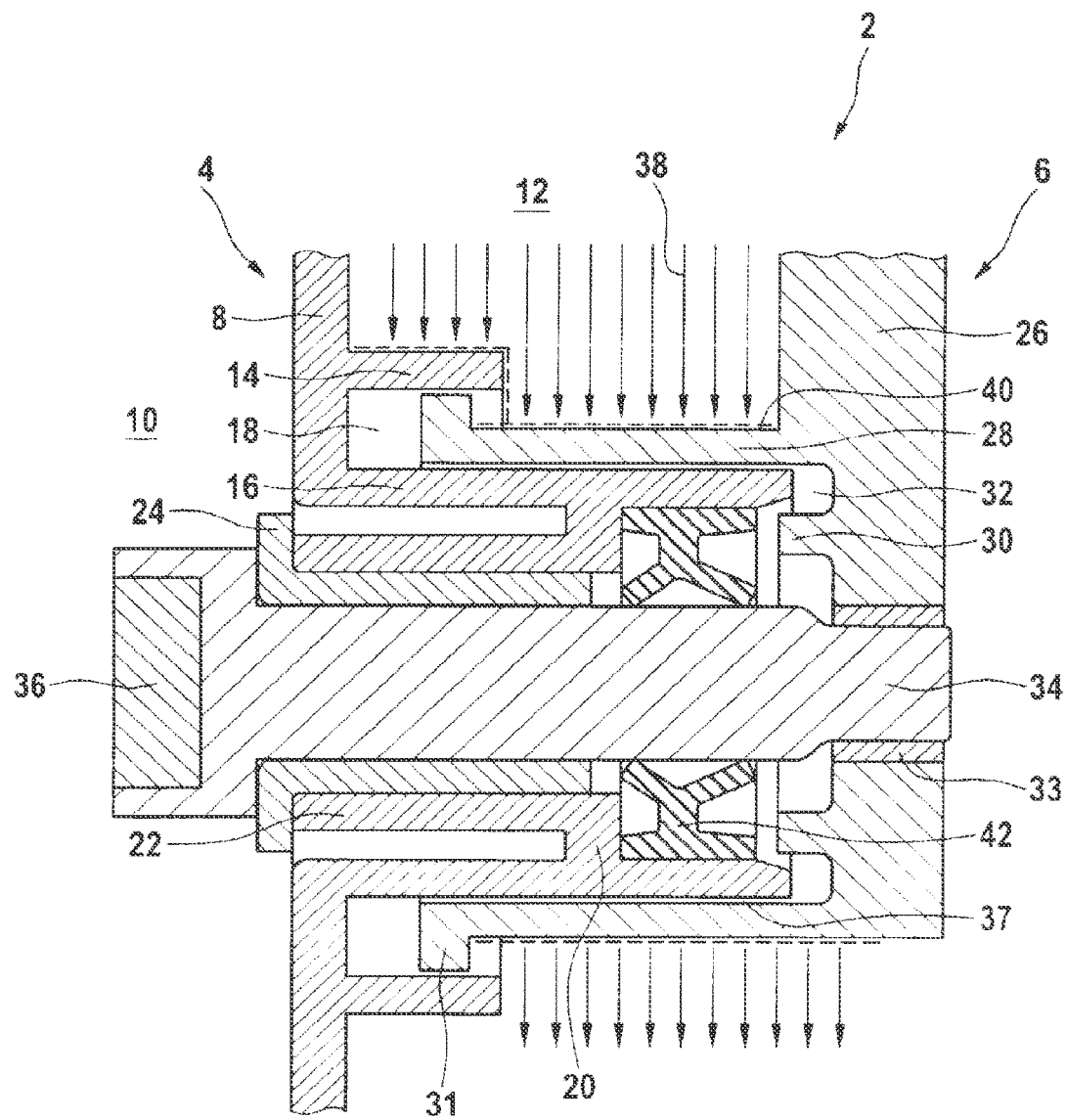
FIG. 2 shows part of a CPS sensor.

FIG. 2 illustrates an embodiment of the CPS sensor 2.

The CPS sensor 2 comprises a housing 4 which can be connected, for example, in a positionally fixed fashion to the chassis 58 of the vehicle 54, and a signal generator 6 which detects the abovementioned relative position of the chassis and suspension or wheel 60 of the vehicle 54 with respect to the chassis 58 and therefore the housing 4. For this purpose, the signal generator 6 is mounted in rotatable fashion with respect to the housing 4.

The housing 4 comprises a housing wall 8 which separates an interior space 10, in which an evaluation circuit (not illustrated further) is accommodated, from an exterior space 12.

In addition, a first housing sleeve 14 and a second housing sleeve 16 which is arranged concentrically with respect to the latter project axially from this housing wall, which housing sleeves 14, 16 together form a housing groove 18 which lies radially between the latter. In addition, a housing flange 20 projects concentrically inward from the first housing sleeve 14, against which a third housing sleeve 22 adjoins its radially inner side. In this third housing sleeve 22, a rotary bearing 24 which is embodied, for example, as a sliding bearing is secured.

The signal generator 6 comprises a lever 26 which is illustrated in a cut-off form in FIG. 2 which can be moved, for example, by the wheel 60 and therefore can be rotated with respect to the housing 4. A first signal generator sleeve 28 and a second signal generator sleeve 30 which is arranged concentrically with respect to the latter project axially from the lever 26, which signal generator sleeves 28, 30 form a signal generator groove 32 radially between them. In this context, a signal generator bead 31 is formed at the end of the first signal generator sleeve 28 lying axially opposite the lever 26. A bushing 33, in which a shaft 34 is held by means of a press fit, is arranged concentrically within the two signal generator sleeves 28, 30. A field signal generator element in the form of a magnet 36 is held in a positionally fixed fashion with respect to the shaft 34 at the end lying axially opposite the lever.

By virtue of the design mentioned above, the magnet 36 can be rotated by means of the shaft 34 with the lever 26 with respect to the housing 4 which is arranged in a positionally fixed fashion with respect to the chassis of the vehicle. In this context, the housing 4 and the signal generator 6 are arranged axially with respect to one another in such a way that the first signal generator sleeve 28 engages axially in the housing groove 18, the second housing sleeve 14 engages axially in the signal generator groove 32, with the result that a labyrinth-like gap 37 is formed between the housing 4 and the signal generator 6. The shaft 34 carries out here the movement of the lever 26, arranged in the exterior space 12, into the interior space 10 with respect to the magnet 36. The latter emits a physical field, in the form of a magnetic field, which changes as a function of the position of the lever 26 and therefore of the magnet 36, which magnetic field is sensed by the evaluation circuit (not illustrated further) and, for example for the determination of the relative position, is evaluated in a manner known per se.

In order to detect the relative position of the chassis and suspension with respect to the chassis, the CPS sensor 2 must be disadvantageously arranged on an underfloor side of the vehicle at which it is subjected to a comparatively large amount of penetrating moisture 38. If this moisture 38 were to penetrate the interior space 10 of the housing 4, it could damage the evaluation circuit (not illustrated further) and make the CPS sensor 2 functionally incapable. For this reason, the labyrinth-like gap 37 is embodied, which gap 37 increases the travel for the moisture 38 and therefore lengthens the time by which the moisture can reach the evaluation circuit.

In addition, the signal generator bead 31 forms, together with the lever 26 and the first signal generator sleeve 28, a further moisture protection element which is formed as a bypass. Said bypass is embodied as a drainage channel 40 which runs on the radial outerside of the signal generator sleeve 28 and which collects the moisture which penetrates from the outer side 12 and conducts it circumferentially around the shaft 34 past the labyrinth-like gap 37 on the radial outer side of the signal generator sleeve 28, with the result that the moisture cannot even penetrate said gap 37.

As yet a further moisture protection element, it is possible, in the present embodiment, to arrange a seal in the form of a Y seal 42 radially between the shaft 34 and the second housing sleeve 14, which seal seals off the interior space 10 of the housing 4 physically with respect to the penetrating moisture.

Figure 3:
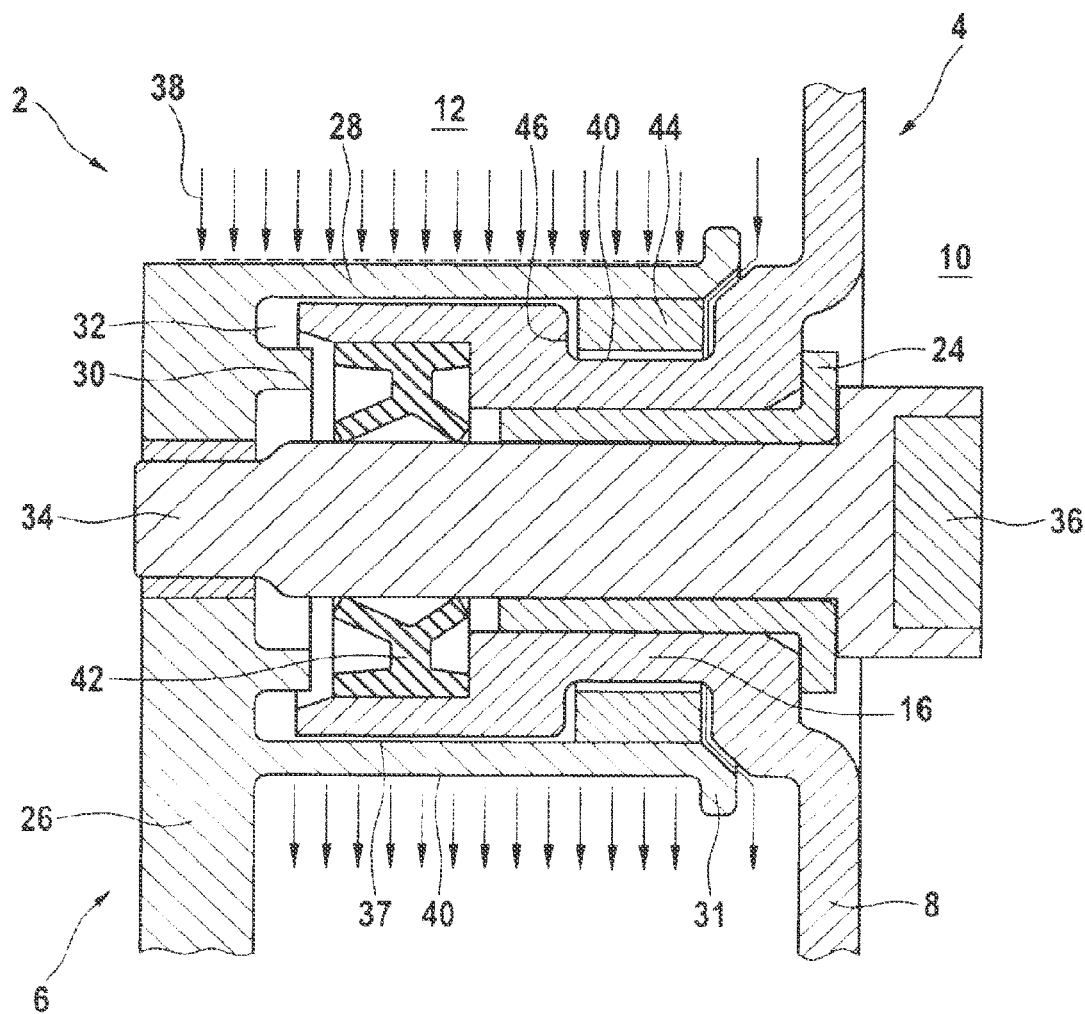
FIG. 3 shows part of an alternative CPS sensor.

FIG. 3 illustrates part of an alternative CPS sensor 2. This alternative CPS sensor 2 only comprises the second housing sleeve 16 and the first signal generator sleeve 28 between which the labyrinth-like gap 37 is embodied.

For this purpose, in the second signal generator sleeve 16 a further drainage channel 40 is embodied, into which a projection 44 projects radially in the present embodiment. Although this projection 44 requires an undercut 46 which has to be manufactured in a costly fashion, the labyrinth-like gap 37 is nevertheless increased further by the projection 44.

Figure 4:
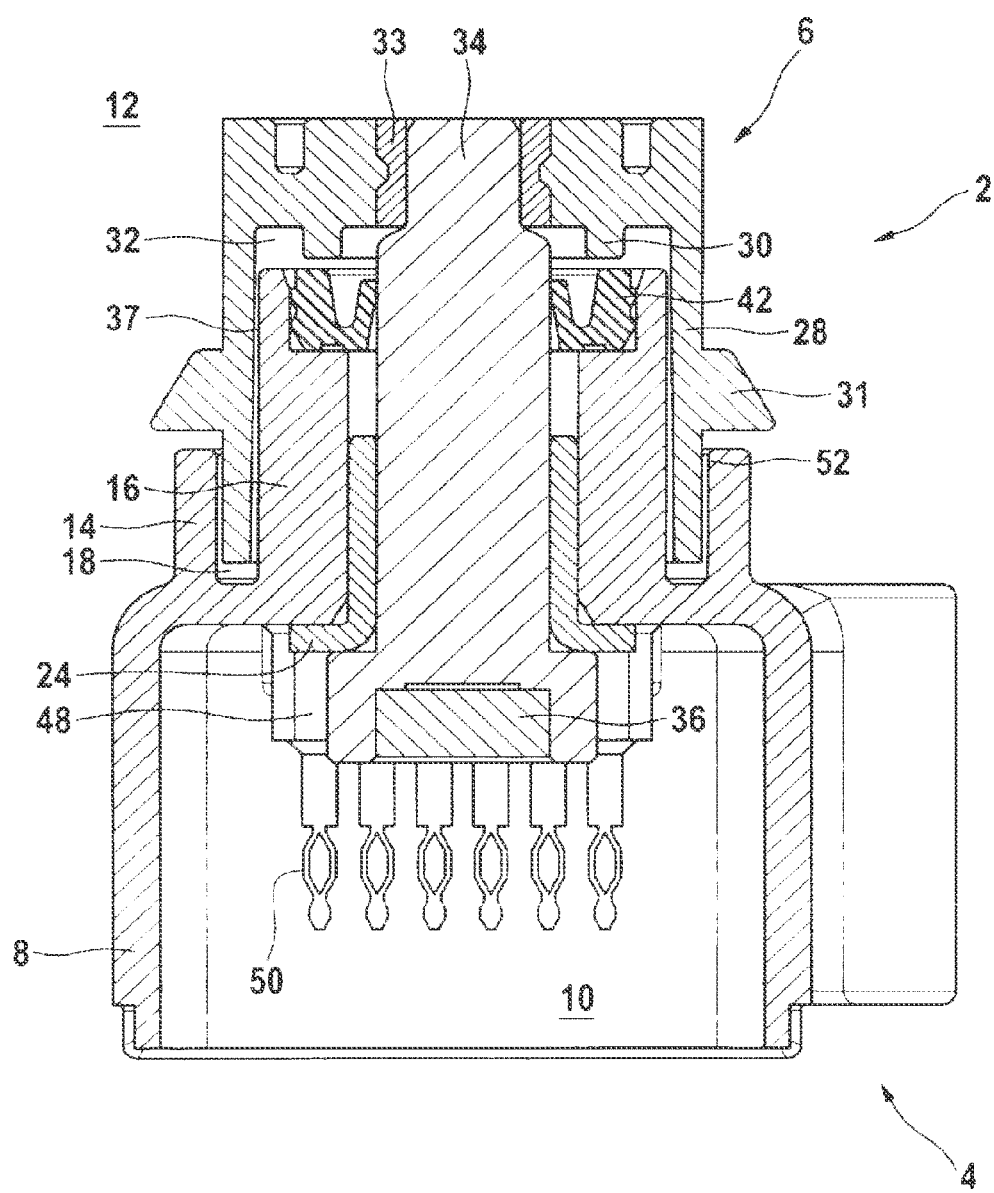
FIG. 4 shows part of a further alternative CPS sensor.

FIG. 4 shows part of a further alternative CPS sensor 2. The lever 26 cannot be seen on the signal generator in FIG. 4. However, instead, FIG. 4 shows the evaluation circuit which is provided with the reference symbol 48. Electrical contacts in the form of what are referred to as pressfits 50, by means of which the evaluation circuit 48 can be connected to a superordinate control device, such as, for example, an engine controller of the vehicle, project from said evaluation circuit 48. Only one of these pressfits 50 is provided with a reference symbol in FIG. 4.

In FIG. 4, the signal generator bead 31 is embodied in a conical fashion and projects over an input 52 of the labyrinth-like gap 37. In this way, the possibility of moisture penetrating into the labyrinth-like gap 37 is reduced further.

Figure 5:
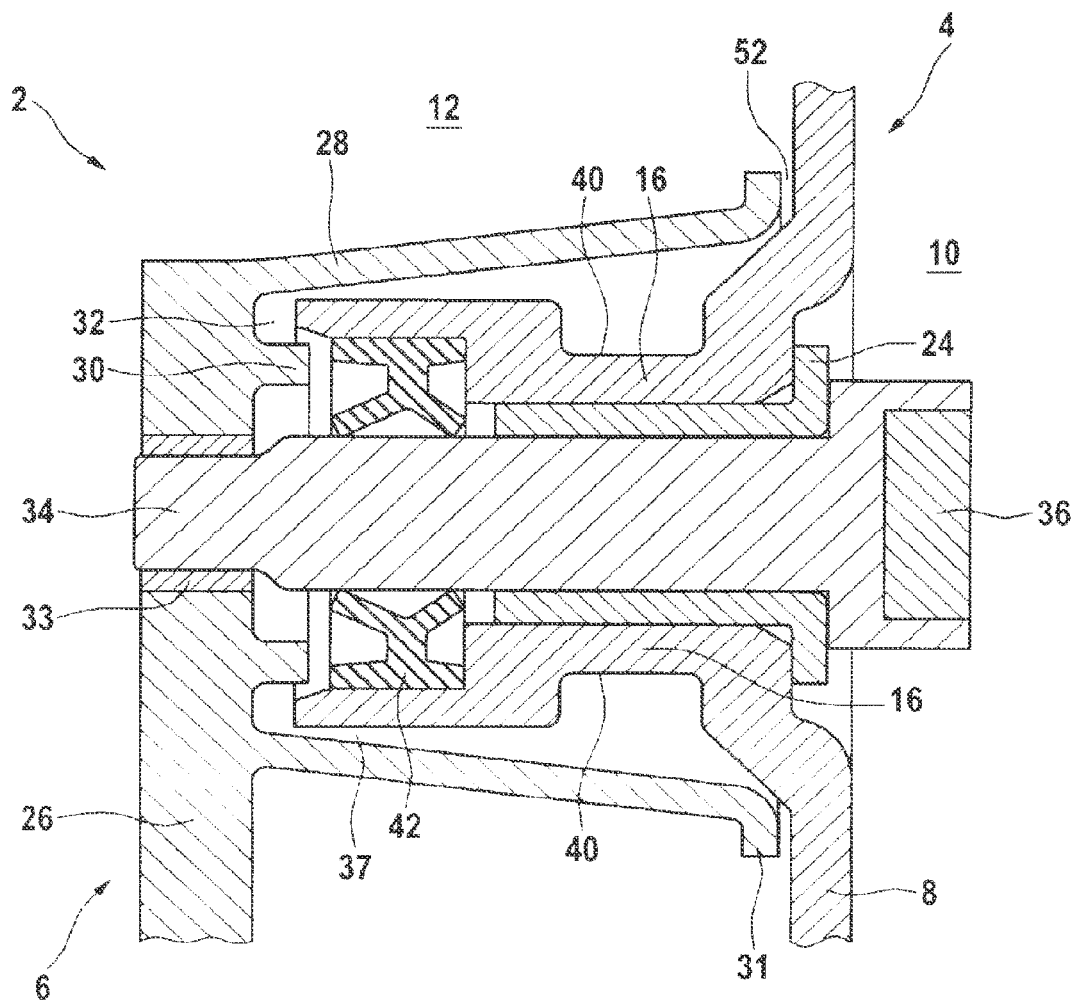
FIG. 5 shows part of yet another CPS sensor.

FIG. 5 illustrates part of yet another CPS sensor 2. In this CPS sensor 2, the first signal generator sleeve 28 is embodied running conically from the inlet point 52 of the labyrinth-like gap 37 to the lever 26. This conical shape is embodied here within the gap 37 and toward the exterior space 12, with the result that moisture is conducted away from the inlet point 52 of the labyrinth-like gap 37 at the exterior space, and is conducted to the inlet point 52 within the labyrinth-like gap 38.

The invention claimed is:

1. A sensor for emitting an electrical signal based on a travel to be detected, comprising
    a housing which spans an interior space and an exterior space,
    a signal generator which penetrates the housing from the exterior space into the interior space and which has a lever in the exterior space, a shaft, and a field signal generator element mounted to the shaft and positioned in the interior space, wherein the lever is configured to rotate the field signal generator element with respect to the housing on the basis of the travel to be detected,
    a moisture protection element having a structure that at least partially blocks moisture from penetrating a gap between the housing and the signal generator, the moisture protection element comprising a pair of sleeves embodied on the housing and a further sleeve embodied on the signal generator, the pair of sleeves defining a circumferential groove radially outward of a first one of the pair of sleeves and radially inward of another one of the pair of sleeves, the further sleeve embodied on the signal generator extending at least partially into the circumferential groove without any component intervening between the further sleeve and the pair of sleeves in a radial direction,
    wherein the first one of the pair of sleeves defines a cavity radially inward of the first one of the pair of sleeves, and the signal generator includes an inner sleeve in addition to the further sleeve, the inner sleeve of the signal generator positioned radially inward from both of the pair of sleeves of the housing and extending at least partially into the cavity, and
    a further moisture protection element comprising a seal arranged between and in direct contact with the first one of the pair of sleeves and the shaft.

2. The sensor as claimed in claim 1, further comprising a drainage channel which is configured to conduct the penetrating moisture past the gap,
    wherein a portion of the further sleeve which is positioned within the circumferential groove comprises an axial surface defining a wall of the drainage channel.

3. The sensor as claimed in claim 2, wherein the drainage channel is embodied in part in the circumferential groove.

4. The sensor as claimed in claim 1, lacking any component intervening between the inner sleeve and the first one of the pair of sleeves in the radial direction.

5. The sensor as claimed in claim 1, wherein the inner sleeve comprises an axial end surface facing the seal.

* * * * *